United States Patent [19]

Aoshima et al.

[11] Patent Number: 5,141,838

[45] Date of Patent: Aug. 25, 1992

[54] PHOTOSENSITIVE COMPOSITION

[75] Inventors: Keitaro Aoshima; Akira Nagashima, both of Shizuoka, Japan

[73] Assignee: Fuji Photo Film Co., Ltd., Ashigara, Japan

[21] Appl. No.: 315,112

[22] Filed: Feb. 24, 1989

[30] Foreign Application Priority Data

Feb. 25, 1988 [JP] Japan .................. 63-42631
Oct. 26, 1988 [JP] Japan ................. 63-270087

[51] Int. Cl.$^5$ .............................................. G03C 1/61
[52] U.S. Cl. .................................. 430/191; 430/192; 430/270; 430/326; 430/906
[58] Field of Search .............. 430/906, 326, 270, 193, 430/192, 191

[56] References Cited

U.S. PATENT DOCUMENTS

| | | | |
|---|---|---|---|
| 3,422,075 | 1/1969 | Taylor | 430/216 |
| 3,725,356 | 4/1973 | Luders | 430/906 |
| 4,335,254 | 6/1982 | Wilson et al. | |
| 4,396,703 | 8/1983 | Matsumoto et al. | 430/302 |
| 4,717,640 | 1/1988 | Stahlhofen | 430/192 |
| 4,865,950 | 9/1989 | DoMinh | 430/275 |
| 4,877,711 | 10/1989 | Aoai et al. | 430/906 |
| 4,885,232 | 12/1989 | Spak | 430/326 |
| 4,929,534 | 5/1990 | Stephani et al. | 430/326 |
| 4,950,582 | 8/1990 | Aoai et al. | 430/906 |

FOREIGN PATENT DOCUMENTS

3742387A1 6/1988 Fed. Rep. of Germany.
3812278A1 11/1988 Fed. Rep. of Germany.

OTHER PUBLICATIONS

Hockh's Chemical Dictionary, McGraw-Hill Book Co., pp. 645–646.

Primary Examiner—Marion E. McCamish
Assistant Examiner—C. D. RoDee
Attorney, Agent, or Firm—Burns, Doane, Swecker & Mathis

[57] ABSTRACT

A photosensitive composition is described, wherein it comprises a high-molecular compound having sulfonamide group to be insoluble in water, but soluble in an aqueous alkaline solution and a positive working photosensitive compound. The photosensitive composition is excellent in coatability and in developability when the composition is used for photosensitive lithographic printing plates.

19 Claims, No Drawings

PHOTOSENSITIVE COMPOSITION

FIELD OF THE INVENTION

This invention relates to a photosensitive composition suitable for use in the production of lithographic plates, IC circuits and photomasks and more particularly to a photosensitive composition comprising a positive working photosensitive compound and a high-molecular weight material excellent in wear resistance and chemical resistance.

BACKGROUND OF THE INVENTION

Photosensitive compositions comprising an o-naphthoquinone diazide compound and a novolak type phenolic resin have been industrially used as very superior photosensitive compositions in the field of photoresists or in the production of lithographic plates.

However, since the novolak type phenolic resins are used as a main ingredient in such conventional photosensitive compositions, they have disadvantages in that adhesion to substrates is poor, films formed therefrom are brittle, their coatability is poor and wear resistance is low. Further, they have such problems that chemical resistance is low and printing durability is insufficient when used as lithographic plates, and printing durability is extremely poor, particularly when UV ink (a greasy ink for lithographic offset printings which cures upon exposure to ultraviolet light) is used. As a method for improving these performances, a burning-in treatment (after exposure and development, a heat-treatment is conducted) is generally carried out. When the burning-in treatment is conducted, however, there is posed the problem of that a low-molecular weight compound in a photosensitive layer is deposited from an image part on an non-image part, etc. and staining is liable to be caused during printing.

Various high-molecular weight materials have been proposed as binders to solve the problem. For example, JP-B-52-41050 (the term "JP-B" as used herein means an "examined Japanese patent publication") discloses polyhydroxystyrene or hydroxystyrene copolymers. Film forming properties are certainly improved by these copolymers. However, the photosensitive composition still has disadvantages in that wear resistance and chemical resistance are poor. Further, JP-A-51-34711 (the term "JP-A" as used herein means as "unexamined published Japanese patent application") discloses the use of high-molecular weight compounds having the structural unit of an acrylic acid derivative in the molecular structure as binders. However, such high-molecular compounds have such problems that the range of proper developing conditions is narrow and wear resistance is insufficient.

SUMMARY OF THE INVENTION

It is, therefore, an object of the present invention to provide a photosensitive composition which contains a high-molecular weight material having excellent wear resistance as a binder, can be developed by an aqueous alkaline developing solution and gives lithographic plates having high printing durability.

Another object of the present invention is to provide a photosensitive composition which is excellent in chemical resistance and gives lithographic plates having high printing durability even when printing is conducted by using UV ink without carrying out any burning-in treatment.

A further object of the present invention is to provide a photosensitive composition which has good adhesion to substrates, gives a flexible film and is excellent in solubility in organic solvents.

These and other objects of the present invention will become apparent from the following descriptions thereof.

DETAILED DESCRIPTION OF THE INVENTION

The present inventors have made studies to achieve the above-described objects, and found that these objects can be achieved by using a novel photosensitive composition. The present invention has been performed on the basis of this finding.

Accordingly, the present invention provides a photosensitive composition comprising a high-molecular weight compound having a sulfonamide group and a positive working photosensitive compound, said high-molecular weight compound being insoluble in water, but soluble in an aqueous alkaline solution.

The water-insoluble, aqueous alkaline solution-soluble high-molecular weight compound which can be used in the present invention is preferably a high-molecular weight compound having $-SO_2-NH-$ linkage in its side chain or main chain, more preferably a high-molecular weight compound having $-SO_2-NH-$ linkage in its side chain.

The water-insoluble, aqueous alkaline solution-soluble high-molecular weight compound having sulfonamide group which can be used in the present invention can be obtained by polymerizing a low-molecular compound having at least one polymerizable unsaturated bond and at least one sulfonamide group, where at least one hydrogen atom is attached to an N atom, per molecule in the presence of a conventional polymerization initiator in an appropriate solvent.

Preferred examples of the low-molecular compound which can be used in the present invention are compounds represented by the following formulas (I) and (II):

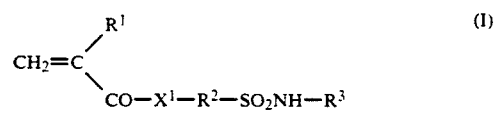

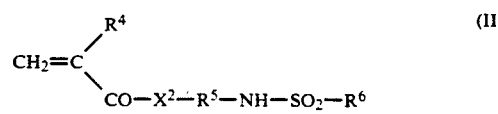

In the above formulas, $X^1$ and $X^2$ each represent $-O-$ or $-NR^7-$. $R^1$ and $R^4$ each represent $-H$ or $-CH_3$. $R^2$ and $R^5$ each represent an alkylene group having from 1 to 12 carbon atoms, a cycloalkylene group having from 3 to 12 carbon atoms, an arylene group having from 6 to 12 carbon atoms or an arakylene group having from 7 to 14 carbon atoms, each of which may have one or more substituent groups. The substituent group in cases where the above mentioned alkylene or cycloalkylene group have a substituent or substituents preferably includes an alkoxy group having from 1 to 6 carbon atoms, an alkanoyl group having from 1 to 6 carbon atoms, an alkanoyloxy group having from 1 to 6 carbon atoms, an alkoxycarbonyl group having from 1 to 6 carbon atoms or an N-alkylcarbamoyl group having from 1 to 6 carbon atoms, a halogen atom or a cyano group. The substituent group in cases where the above mentioned arylene or aralkylene group have a substituent or substituents preferably includes an alkyl group having from 1 to 6 carbon atoms in addition to the above groups for a substituent on an alkylene group and a cycloalkylene group. $R^3$ represents —H, an alkyl group having from 1 to 12 carbon atoms, a cycloalkyl group having from 3 to 12 carbon atoms, an aryl group having from 6 to 12 carbon atoms or an aralkyl group having 7 to 14 carbon atoms, each of which may have one or more substituent groups. Typical substituent groups therefor include the same as that for $R^2$ and $R^5$. $R^6$ is an alkyl group having from 1 to 12 carbon atoms, a cycloalkyl group having from 3 to 12 carbon atoms, an aryl group having from 6 to 12 carbon atoms or an aralkyl group having from 7 to 14 carbon atoms, each of which may have one or more substituent groups. Typical substituent groups therefor include the same as that for $R^2$ and $R^5$. $R^7$ represents a hydrogen atom, an alkyl group having from 1 to 12 carbon atoms, a cycloalkyl group having from 3 to 12 carbon atoms, an aryl group having from 6 to 12 carbon atoms or an aralkyl group having from 7 to 14 carbon atoms, each of which may have one or more substituent groups, the substituent group including the same as that for $R^2$ and $R^5$.

Among the low-molecular weight compounds represented by the formulas (I) and (II), there are preferred compounds where $R^2$ and $R^5$ represent each an alkylene group having from 2 to 6 carbon atoms, a cycloalkylene group having 5 or 6 carbon atoms, phenylene group or naphthylene group and phenylene and naphthylene groups may be optionally substituted by an alkyl group having from 1 to 6 carbon atoms, an alkoxy group having from 1 to 6 carbon atoms or a halogen atom. $R^3$ is H, an alkyl group having from 1 to 6 carbon atoms, a cycloalkyl group having 5 or 6 carbon atoms, phenyl group or naphthyl group and phenyl and naphthyl groups may be optionally substituted by an alkyl group having from 1 to 6 carbon atoms, an alkoxy group having from 1 to 6 carbon atoms or a halogen atom; $R^6$ is an alkyl group having from 1 to 6 carbon atoms, a cycloalkyl group having 5 or 6 carbon atoms, phenyl group or naphthyl group and phenyl and naphthyl groups may be optionally substituted by an alkyl group having from 1 to 6 carbon atoms, an alkoxy group having from 1 to 6 carbon atoms or a halogen atom and $R^7$ is hydrogen atom.

The preferable low-molecular weight compounds include aminosulfonylphenyl mathacrylamide, aminosulfonylphenyl acrylamide, sulfonylphenyl methacrylamide, sulfonylaminophenyl acrylamide, aminosulfonylphenyl methacrylate, aminosulfonylphenyl acrylate, sulfonylaminophenyl methacrylate, sulfonylaminophenyl acrylate; aminosulfonylnaphthyl methacrylamide, aminosulfonylnaphthyl acrylamide, sulfonylaminonaphthyl methacrylamide, sulfonylaminonaphthyl acrylamide, aminosulfonylnaphthyl methacrylate, aminosulfonylnaphthyl acrylate, sulfonylaminonaphthyl methacrylate, sulfonylaminonaphthyl acrylate; sminosulfonylethyl methacrylamide, aminosulfonylethyl acrylamide, sulfonylaminoethyl methacrylamide, sulfonylamionethyl acrylamide; aminosulfonylethyl methacrylate, aminosulfonylethyl acrylate, sulfonylaminoethylmethacrylate, sulfonylamionethyl acrylate etc.

Typical examples of the low-molecular weight compounds include methacrylamides such as
N-(o-amino-sulfonylphenyl)methacrylamide,
N-(m-aminosulfonylphenyl)methacrylamide,
N-(p-aminosulfonylphenyl)methacrylamide,
N-(o-methylaminosulfonylphenyl)methacrylamide,
N-(m-methylaminosulfonylphenyl)methacrylamide,
N-(p-methylaminosulfonylphenyl)methacrylamide,
N-(o-ethylaminosulfonylphenyl)methacrylamide,
N-(m-ethylaminosulfonylphenyl)methacrylamide,
N-(p-ethylaminosulfonylphenyl)methacrylamide,
N-(o-n-propylaminosulfonylphenyl)methacrylamide,
N-(m-n-propylaminosulfonylphenyl)methacrylamide,
N-(p-n-propylaminosulfonylphenyl)methacrylamide,
N-(o-isopropylaminosulfonylphenyl)methacrylamide,
N-(m-isopropylaminosulfonylphenyl)methacrylamide,
N-(p-isopropylaminosulfonylphenyl)methacrylamide,
N-(o-n-butylaminosulfonylphenyl)methacrylamide,
N-(m-n-butylaminosulfonylphenyl)methacrylamide,
N-(p-n-butylaminosulfonylphenyl)methacrylamide,
N-(o-isobutylaminosulfonylphenyl)methacrylamide,
N-(m-isobutylaminosulfonylphenyl)methacrylamide,
N-(p-isobutylaminosulfonylphenyl)methacrylamide,
N-(o-sec-butylaminosulfonylphenyl)methacrylamide,
N-(m-sec-butylaminosulfonylphenyl)methacrylamide,
N-(p-sec-butylaminosulfonylphenyl)methacrylamide,
N-(o-t-butylaminosulfonylphenyl)methacrylamide,
N-(m-t-butylaminosulfonylphenyl)methacrylamide,
N-(p-t-butylaminosulfonylphenyl)methacrylamide,
N-(o-phenylaminosulfonylphenyl)methacrylamide,
N-(m-phenylaminosulfonylphenyl)methacrylamide,
N-(p-phenylaminosulfonylphenyl)methacrylamide,
N-(o-($\alpha$-naphthylaminosulfonyl)phenyl)methacrylamide,
N-(m-($\alpha$-naphthylaminosulfonyl)phenyl)methacrylamide,
N-(p-($\alpha$-naphthylaminosulfonyl)phenyl)methacrylamide,
N-(o-($\beta$-naphthylaminosulfonyl)phenyl)methacrylamide,
N-(m-($\beta$-naphthylaminosulfonyl)phenyl)methacrylamide,
N-(p-($\beta$-naphthylaminosulfonyl)phenyl)methacrylamide,
N-(1-(3-aminosulfonyl)naphthyl)methacrylamide,
N-(1-(3-methylaminosulfonyl)naphthyl)methacrylamide,
N-(1-(3-ethylaminosulfonyl)naphthyl)methacrylamide,
N-(o-methylsulfonylaminophenyl)methacrylamide,
N-(m-methylsulfonylaminophenyl)methacrylamide,
N-(p-methylsulfonylaminophenyl)methacrylamide,
N-(o-ethylsulfonylaminophenyl)methacrylamide,
N-(m-ethylsulfonylaminophenyl)methacrylamide,
N-(p-ethylsulfonylaminophenyl)methacrylamide,
N-(o-phenylsulfonylaminophenyl)methacrylamide,
N-(m-phenylsulfonylaminophenyl)methacrylamide,
N-(p-phenylsulfonylaminophenyl)methacrylamide,
N-(o-(p-methylphenylsulfonylamino)phenyl)methacrylamide,
N-(m-(p-methylphenylsulfonylamino)phenyl)methacrylamide,
N-(p-(p-methylphenylsulfonylamino)phenyl)methacrylamide,
N-(p-($\alpha$-naphthylsulfonylamino)phenyl)methacrylamide,
N-(p-($\beta$-naphthylsulfonylamino)phenyl)methacrylamide,
N-(2-methylsulfonylaminoethyl)methacrylamide, N-(2-ethylsulfonylaminoethyl)methacrylamide,
N-(2-phenylsulfonylaminoethyl)methacrylamide,
N-(2-p-methylphenylsulfonylaminoethyl)methacrylamide,
N-(2-α-naphthylsulfonylaminoethyl)methacrylamide,
N-(2-β-naphthylsulfonylaminoethyl)methacrylamide,
acrylamides having substituent groups corresponding to those of the above-described methacrylamides; methacrylates such as
o-aminosulfonylphenyl methacrylate,
m-aminosulfonylphenyl methacrylate,
p-aminosulfonylphenyl methacrylate,
o-methylaminosulfonylphenyl methacrylate,
m-methylaminosulfonylphenyl methacrylate,
p-methylaminosulfonylphenyl methacrylate,
o-ethylaminosulfonylphenyl methacrylate,
m-ethylaminosulfonylphenyl methacrylate,
p-ethylaminosulfonylphenyl methacrylate,
o-n-propylaminosulfonylphenyl methacrylate,
m-n-propylaminosulfonylphenyl methacrylate,
p-n-propylaminosulfonylphenyl methacrylate,
o-isopropylaminosulfonylphenyl methacrylate,
m-isopropylaminosulfonylphenyl methacrylate,
o-n-butylaminosulfonylphenyl methacrylate,
m-n-butylaminosulfonylphenyl methacrylate,
p-n-butylaminosulfonylphenyl methacrylate,
m-isobutylaminosulfonylphenyl methacrylate,
p-isobutylaminosulfonylphenyl methacrylate,
m-sec-butylaminosulfonylphenyl methacrylate,
p-sec-butylaminosulfonylphenyl methacrylate,
m-t-butylaminosulfonylphenyl methacrylate,
p-t-butylaminosulfonylphenyl methacrylate,
o-phenylaminosulfonylphenyl methacrylate,
m-phenylaminosulfonylphenyl methacrylate,
p-phenylaminosulfonylphenyl methacrylate,
m-(α-naphthylaminosulfonyl)phenyl methacrylate,
p-(α-naphthylaminosulfonyl)phenyl methacrylate,
m-(β-naphthylaminosulfonyl)phenyl methacrylate,
p-(β-naphthylaminosulfonyl)phenyl methacrylate,
1-(3-aminosulfonyl)naphthyl methacrylamide,
1-(3-methylaminosulfonyl)naphthyl methacrylamide,
1-(3-ethylaminosulfonyl)naphthyl methacrylamide,
o-methylsulfonylaminophenyl methacrylate,
m-methylsulfonylaminophenyl methacrylate,
p-methylsulfonylaminophenyl methacrylate,
o-ethylsulfonylaminophenyl methacrylate,
m-ethylsulfonylaminophenyl methacrylate,
p-ethylsulfonylaminophenyl methacrylate,
o-phenylsulfonylaminophenyl methacrylate,
m-phenylsulfonylaminophenyl methacrylate,
p-phenylsulfonylaminophenyl methacrylate,
o-(p-methylphenylsulfonylamino)phenyl methacrylate,
m-(p-methylphenylsulfonylamino)phenyl methacrylate,
p-(p-methylphenylsulfonylamino)phenyl methacrylate,
p-(α-naphthylsulfonylamino)phenyl methacrylate,
p-(β-naphthylsulfonylamino)phenyl methacrylate,
2-methylsulfonylaminoethyl methacrylate,
2-ethylsulfonylaminoethyl methacrylate,
2-phenylsulfonylaminoethyl methacrylate,
2-p-methylphenylsulfonylaminoethyl methacrylate,
2-α-naphthylsulfonylaminoethyl methacrylate and
2-β-naphthylsulfonylaminoethyl methacrylate;
and acrylates having substituent groups corresponding to those of the above-described methacrylates.

Other preferred examples of low-molecular weight compounds having a sulfonamide group and a polymerizable unsaturated bond, which can be used in the present invention include compounds having the following general formulas (III) to (V)

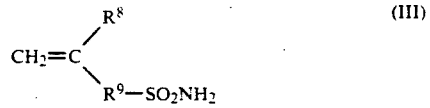  (III)

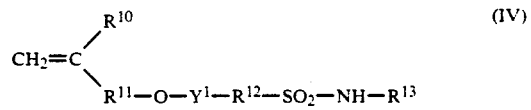  (IV)

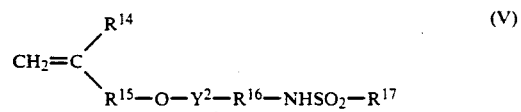  (V)

In the formulas (III) to (V), $R^8$, $R^{10}$ and $R^{14}$ each represent hydrogen atom, a halogen atom or methyl group and each is preferably hydrogen atom.

$R^9$ represents an alkylene group having from 1 to 12 carbon atoms, a cycloalkylene group having from 3 to 12 carbon atoms, an arylene group having from 6 to 12 carbon atoms or an aralkylene group having from 7 to 14 carbon atoms and each of which may have one or more substituent groups. The substituent group preferably includes the same as that for $R^2$ and $R^5$ in the aforementioned formulas (I) and (II). $R^9$ is preferably methylene, phenylene or naphthylene group, each of which may have one or more substituent groups which are selected from the groups of an alkyl group having from 1 to 6 carbon atoms, an alkoxy group having from 1 to 6 carbon atoms and a halogen atom.

$R^{11}$ and $R^{15}$ each represent a single bond or an alkylene group having from 1 to 12 carbon atoms, a cycloalkylene group having from 3 to 12 carbon atoms, an arylene group having from 6 to 12 carbon atoms or an aralkylene group having from 7 to 14 carbon atoms, each of which may have one or more substituent groups. The substituent group preferably includes the same as that for $R^2$ and $R^5$ in the aforementioned formulas (I) and (II). $R^{11}$ and $R^{15}$ are preferably a single bond or methylene group.

$R^{12}$ and $R^{16}$ each represent an alkylene group having from 1 to 12 carbon atoms, a cycloalkylene group having from 3 to 12 carbon atoms, an arylene group having from 6 to 12 carbon atoms or an aralkylene group having from 7 to 14 carbon atoms, each of which may have one or more substituent groups which are preferably selected from the substituent groups for $R^2$ and $R^5$ in the aforementioned formulas (I) and (II). $R^{12}$ and $R^{16}$ are preferably an alkylene group having from 1 to 6 carbon atoms, phenylene group or naphthylene group. Phenylene and naphthylene groups may be optionally substituted by an alkyl group having from 1 to 6 carbon atoms, an alkoxy group having from 1 to 6 carbon atoms or a halogen atom.

$R^{13}$ represents a hydrogen atom, an alkyl group having from 1 to 12 carbon atoms, a cycloalkyl group having from 3 to 12 carbon atoms, an aryl group having from 6 to 12 carbon atoms or an aralkyl group having from 7 to 14 carbon atoms, each group of which may have one or more substituent groups. The substituent group preferably includes the same as that for $R^2$ and $R^5$. $R^{13}$ is preferably a hydrogen atom, an alkyl group having from 1 to 6 carbon atoms, a cycloalkyl group having 5 or 6 carbon atoms, phenyl group or naphthyl group. Phenyl and naphthyl groups may be optionally substituted by an alkyl group having from 1 to 6 carbon atoms, an alkoxy group having from 1 to 6 carbon atoms or a halogen atom.

$R^{17}$ represents an alkyl group having from 1 to 12 carbon atoms, a cycloalkyl group having from 3 to 12 carbon atoms, an aryl group having from 6 to 12 carbon atoms or an aralkyl group having from 7 to 14 carbon atoms, each of which may have one or more substituent groups. The substituent group preferably includes the same as that for $R^2$ and $R^5$. $R^{17}$ is preferably an alkyl group having from 1 to 6 carbon atoms, a cycloalkyl group having 5 or 6 carbon atoms, phenyl group or naphthyl group. Phenyl and naphthyl groups may be optionally substituted by an alkyl group having from 1 to 6 carbon atoms, an alkoxy group having from 1 to 6 carbon atoms and a halogen atom.

$Y^1$ and $Y^2$ each represent a single bond or

Examples of the compounds represented by the formulas (III) to (V) include p-aminosulfonylstyrene, p-aminosulfonyl-α-methylstyrene, p-aminosulfonylphenyl allyl ether, p-(N-methylaminosulfonyl)phenyl allyl ether, vinyl methylsulfonylaminoacetate, phenylsulfonylaminovinylacetate, methylsulfonylamino-allylacetate, phenylsulfonylamino-allylacetate, phenylsulfonylamino-allylacetate and p-methylsulfonylaminophenyl allyl ether.

The high-molecular weight compound having sulfonamide group which can be used in the present invention may be a homopolymer of the above-described low-molecular weight compound having a polymerizable unsaturated bond and sulfonamide group where at least one H atom is attached to N atom in the molecule, or the high-molecular weight compound having sulfonamide group may be a copolymer of two or more of said low-molecular weight compounds. However, there is preferred a copolymer of said low-molecular weight compound with at least one compound having at least one polymerizable unsaturated bond and no sulfonamide group.

Examples of such a compound having at least one polymerizable unsaturated bond and no sulfonamide group are compounds having a polymerizable unsaturated bond selected from the group consisting of acrylic acid, methacrylic acid, acrylates, acrylamides, methacrylates, methacrylamides, allyl compounds, vinyl ethers, vinyl esters, styrenes, crotonates, etc. Typical examples of such compounds include acrylates such as alkyl acrylates (the alkyl moiety thereof having preferably from 1 to 10 carbon atoms) (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate) and aryl acrylates (e.g. phenyl acrylate); methacrylates such as alkyl methacrylates (the alkyl moiety thereof having preferably from 1 to 10 carbon atoms) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate) and aryl methacrylates (e.g., phenyl methacrylate, cresyl methacrylate and naphthyl methacrylate); acrylamides such as acrylamide, N-alkylacrylamides (the alkyl moiety thereof having preferably from 1 to 10 carbon atoms, such as methyl, ethyl, propyl, butyl, t-butyl, heptyl, octyl, cyclohexyl, hydroxyethyl and benzyl), N-arylacrylamides (examplex of the aryl group being phenyl, tolyl, nitrophenyl, naphthyl and hydroxyphenyl), N,N-dialkylacrylamides (the alkyl moiety thereof having preferably from 1 to 10 carbon aboms, such as methyl, ethyl, butyl, isobutyl, ethylhexyl and cyclohexyl), N,N-arylacrylamides (an example of the aryl group being phenyl), N-methyl-N-phenylacrylamide, N-hydroxyethyl-N-methylacrylamide and N-2-acetamidoethyl-N-acetylacrylamide; methacrylamides such as methacrylamide, N-alkylmethacrylamides (the alkyl moiety thereof having preferably from 1 to 10 carbon atoms, such as methyl, ethyl, t-butyl, ethylhexyl, hydroxyethyl and cyclohexyl), N-arylmethacrylamides (an example of the aryl group being phenyl), N,N-dialkylmethacrylamides (examples of the alkyl group being ethyl, propyl and butyl), N,N-diarylmethacrylamides (an example of the aryl group being phenyl), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate and allyl lactate) and allyloxyethanol; vinyl ethers such as alkylvinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ehter, dimethylaminoethyl vinyl ether, diethylaminoethyl vinyl ether, butylaminoethyl vinyl ether, benzyl vinyl ether and tetrahydrofurfuryl vinyl ether) and vinyl aryl ethers (e.g., vinyl phenyl ether, vinyl tolyl ether, vinyl chlorophenyl ether, vinyl 2,4-dichlorophenyl ether, vinyl naphthyl ether and vinyl anthranyl ether); vinyl esters such as vinyl butyrate, vinyl isobutyrate, vinyl trimethylacetate, vinyl diethylacetate, vinyl pivalate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinly salicylate, vinyl chlorobenzoate, vinyl tetrachlorobenzoate and vinyl naphthoate; styrenes such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene) and halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene); crotonates such as alkyl crotonates (e.g., butyl crotonate, hexyl crotonate and glycerol monocrotonate); dialkyl itaconates (e.g., dimethyl itaconate, diethyl itaconate and dibutyl itaconate); dialkyl maleates or fumarates (e.g., dimethyl maleate and dibutyl fumarate); and acrylonitrile and methacrylonitrile.

Among these compounds having a polymerizable unsaturated bond, there are preferred acrylates, methacrylates, methacrylamides, acrylamides, acrylonitrile, methacrylonitrile, methacrylic acid and acrylic acid.

The copolymers of at least one member of these compounds having a polymerizable unsaturated bond with at least one member of the compounds having sulfonamide group and a polymerizable unsaturated bond can be used in any form of block, random and graft copolymers.

The amount of the structural unit having sulfonamide group in the copolymer is preferably at least 5 mol %, more preferably 10 to 90 mol % based on the total amount of the structural units constituting the copolymer.

Examples of solvents which can be used in the synthesis of these copolymers include ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate and ethyl lactate.

These solvents may be used either along or as a mixture of two or more of them.

In addition to the above-described copolymers, there can be used polyurethane resins as the water-insoluble, aqueous alkaline solution-soluble high-molecular weight compounds having sulfonamide group which are suitable for use in the present invention.

The polyurethane resins suitable for use in the present invention are those having a fundamental skeleton composed of a reaction product between a diisocyanate compound and a diol compound having sulfonamide group where at least one H atom is attached to N atom.

Typical examples of the diisocyanate compound which can be used in the present invention include aromatic diisocyanate compounds such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic ciisocyanate compounds such as hexamethylene diisocyanate, trimethylhexamethylene diisocyanate, lysine diisocyanate and dimer acid diisocyante; alicyclic diisocyanate compounds such as isophorone diisocyanate, 4,4'-methylenebis(cyclohexyl isocyanate), methylcyclohexane-2,4(or 2,6)-diisocyanate and 1,3-di(isocyanatomethyl) cyclohexane; and other diisocyanate compounds such as a reaction product between a diol and a diisocyanate (e.g., an addition product of one mol of 1,3-butylene glycol to two mol of tolylene diisocyanate).

Examples of the diol compound having sulfonamide group where at least one H atom is attached to N atom, include p-(1,1-dihydroxymethylethylcarbonylamino)-benzenesulfonamide, N-ethyl derivative of p-(1,1-dihydroxymethylethylcarbonylamino)benzenesulfonamide, N-(m-methylsulfonylaminophenyl)-2,2-dihydroxymethylpropaneamide, N-(p-methylsulfonylaminophenyl)-2,2-dihydroxymethylpropaneamide, N-(m-ethylsulfonylaminophenyl)-2,2-dihydroxymethylpropaneamide, N-(p-ethylsulfonylaminophenyl)-2,2-dihydroxymethylpropaneamide, N-(2,2-(dihydroxyethylaminocarbonyl)ethyl)methanesulfonamide, N-(2,2-(dihydroxyethylaminocarbonyl)ethyl)benzenesulfonamide and N-(2,2-(dihydroxyethylaminocarbonyl)ethyl)-p-toluenesulfonamide.

These diol compounds may be used either alone or as a mixture of two or more of them.

Further, diol compounds having no sulfonamide group and optionally other substituent groups non-reactive with the isocyanates can be used together with the above-described diol compounds.

Typical examples of such diol compounds include ethylene glycol, diethylene glycol, triethylene glycol, tetraetylene glycol, propylen glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-$\beta$-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylen oxide adduct of bisphenol F, a propylen oxide adduct of bisphenol F, an ethylen oxide adduct of hydrogenated bisphenol A, a propylene oxide adduct of hydrogenated bisphenol A, hydroquinonedihydroxy ethyl ether, p-xylylene glycol, dihydroxyethyl sulfone, bis(2-hydroxyethyl)-2,4-tolylene dicarbamate, 2,4-tolylene-bis-(2-hydroxyethylcarbamide), bis(2-hydroxyethyl)-m-xylylene dicarbamate, bis(2-hydroxyethyl) isophthalate, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid and tartaric acid.

The polyurethane resin of the present invention can be synthesized by heating the above-described diisocyanate compound and the above-described diol compound in an aprotic solvent in the presence of a conventional catalyst which is active according to reactivity. The molar ratio of the diisocyanate compound to the diol compound is preferably in the range of from 0.8:1 to 1.2:1. The final resin having no terminal isocyanate group left in the polymer can be synthesized by treating the polymer with alcohols or amines, when the polymer has an isocynate group at its terminal, said terminal isocyanate group being left unreacted.

For the purpose of the present invention, it is desirable that the high-molecular weight compounds of the present invention have a weight-average molecular weight of preferably 2,000 or higher, more preferably from 5,000 to 300,000 and a number-average molecular weight of preferably 1,000 or higher, more preferably from 2,000 to 250,000 and a polydisperse degree (weight-average molecular weight/number-average molecular weight) of preferably not lower than 1, more preferably from 1.1 to 10.

Unreacted monomers may be left behind in the high-molecular weight compounds of the present invention. However, it is desirable that the content of the unreacted monomers in the high-molecular weight compounds is not more than 15% by weight.

The high-molecular weight compounds of the present invention may be used either alone or as a mixture of two or more of them. The amount of the high-molecular weight compound to be incorporated into the photosensitive composition is from about 5 to 95% by weight, preferably from about 10 to 85% by weight.

As examples of the positive working photosensitive compounds which can be used in the present invention, there can be mentioned o-naphthoquinone diazide compounds.

As the o-naphthoquinone diazide compounds which can be used in the present invention, esters derived from 1,2-diazonaphthoquinonesulfonic acid chloride and a pyrogallol-aceton resin disclosed in U.S. Pat. No. 3,635,709 are preferred. Other suitable examples of o-quinone diazide compounds include esters derived from 1,2-diazonaphthoquinonesulfonic acid chloride and a phenolformaldehyde resin disclosed in U.S. Pat. Nos. 3,046,120 and 3,188,210. Other useful o-naphthoquinone diazide compounds have been reported in many patent specifications. For example, they are disclosed in JP-A-47-5303, JP-A-48-63802, JP-A-48-63803, JP-A-48-96575, JP-A-49-38701, JP-A-48-13354, JP-B-37-18015, JP-B-41-11222, JP-B-45-9610, JP-B-49-17481, U.S. Pat. Nos. 2,797,213, 3,454,400, 3,544,323, 3,573,917, 3,674,495 and 3,785,825, U.K. Patents 1,227,602, 1,251,345, 1,267,005, 1,329,888 and 1,330,932 and German Patent 854,890.

Particularly preferred o-naphthoquinone dizazide compounds which are used in the present invention are compounds obtained by the reaction of a polyhydroxy compound having a molecular weight of not higher than 1,000 with 1,2-diazonaphthoquinonesulfonic acid chloride. Specific examples of such compounds include those disclosed in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950 and JP-A-62-178562, U.S. patent application Ser. No. 245,190 filed Sep. 16, 1988 or European Patent Application No. 88115250.8, and U.S. Pat. Nos. 3,102,809, 3,126,281, 3,130,047, 3,148,983, 3,184,310, 3,188,210 and 4,639,406.

In the synthesis of these o-naphthoquinone diazide compounds, it is preferred that 0.2 to 1.2 equivalent, particularly 0.3 to 1.0 equivalent of 1,2-diazonaphthoquinonesulfonic acid chloride per one equivalent of hydroxyl group in the polyhydroxy compound is reacted.

The resulting o-naphthoquinone diazide compounds are in the form of a mixture composed of various amounts of compounds where the amounts of introduced 1,2-diazonaphthoquinonesulfonic ester group and the introduced positions thereof are different. It is preferred that the ratio of the compounds where all of hydroxyl groups are converted by 1,2-diazonaphthoquinonesulfonic ester (the content of the compounds which are fully esterified) is at least 5 mol %, particularly 20 to 99 mol %.

As positive working photosensitive compounds without using the o-naphthoquinone diazide compound, polymer compounds having o-nitrocarbinol ester group described in, for example, JP-B-56-2696 can be used in the present invention.

Further, combinations of a compound generating an acid by photolysis with a compound having —C—O—C group or —C—O—Si group which is dissociated by an acid, can be used in the present invention.

As examples of such combinations, there can be mentioned the combination of a compound generating an acid by photolysis with an acetal or an O,N-acetal compound (JP-A-48-89003), the combination thereof with an orthoester or amidoacetal compound (U.S. Pat. No. 4,101,323), the combination thereof with a polymer having an acetal or ketal group in its main chain (U.S. Pat. No. 4,247,611), the combination thereof with an enol ether compound (U.S. Pat. No. 4,248,957), the combination thereof with an N-acylimino carbon compound (U.S. Pat. No. 4,250,247), the combination thereof with a polymer having an orthoester group in its main chain (U.S. Pat. No. 4,311,782), the combination thereof with a silyl ester compound (U.S. Pat. No. 4,752,552) and the combination thereof with a silyl ether compound (U.S. Pat. Nos. 4,752,552 and 4,770,977).

The amount of the positive working photosentive compound (including the above combination) in the photosensitive composition of the present invention is preferably from 10 to 50% by weight, more preferably from 15 to 40% by weight.

In addition to the high-molecular weight compound having sulfonamide group, the photosensitive composition of the present invention may optionally contain known alkali-soluble high-molecular weight compounds such as a phenolformaldehyde resin, a cresol-formaldehyde resin (e.g., a m-cresol-formaldehyde resin, a p-cresol-formaldehyde resin, a m-/p-mixed cresol-formaldehyde resin or a phenol/cresol (m-, p- or m-/p-mixed) mixture-formaldehyde resin), a phenol-modified xylene resin, a poly hydroxystyrene and a polyhalogenated hydroxystyrene. For the purpose of the present invention, it is desirable that these alkali-soluble high-molecular weight compounds have a weight-average molecular weight of from 500 to 20,000 and a number-average molecular weight of from 200 to 60,000.

The amount of the alkali-soluble high-molecular weight compound to be added is not more than 70% by weight based on the total amount of the composition.

Further, it is preferred from the viewpoint of an improvement in ink-receptivity of image that there is used a condensate of a phenol having an alkyl group having from 3 to 8 carbon atoms as a substituent group with fromaldehyde such as a t-butylphenol-formaldehyde resin or an octylphenol-formaldehyde resin disclosed in U.S. Pat. No. 4,123,279.

A cyclic acid anhydride for increasing sensitivity, a printing-out agent for obtaining a visible image immediately after exposure, a dye as an image coloring agent, other filler, etc. may be added to the composition of the present invention. Examples of the cyclic acid anhydride include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, α-phenylmaleic anhydride, succinic anhydride and pyromellitic anhydride disclosed in U.S. Pat. No. 4,115,128 as well as those described in U.S. Pat. No. 4,442,195. When 1 to 15% by weight (based on the amount of the composition) of the cyclic acid anhydride is incorporated in the composition, sensitivity can be increased about three times at maximum. As the printing-out agent for obtaining a visible image immediately after exposure, there can be used combinations of a photosensitive compound releasing an acid by exposure with an organic dye capable of forming a salt. Typical examples of the combinations include the combinations of an o-naphthoquinonediazido-4-sulfonic acid halogenide with a salt-forming organic dye disclosed in U.S. Pat. No. 3,969,118 and the combinations of a trihalomethyl compound with a salt-forming organic dye disclosed in JP-A-53-36223, U.S. Pat. No. 4,232,106, JP-A-60-3626, JP-A-61-143748, JP-A-61-151644 and EP-A-262788. As the image coloring agent, other dyes in addition to said salt-forming organic dyes can be used. Dyes suitable for use in the present invention include oil-soluble dyes and basic dyes including said salt-forming organic dyes. Typical examples of the dyes include Oil Yellow #101, Oil Yellow #130, Oil Pink #312, Oil Green BG, Oil Blue BOS, Oil Blue #603, Oil Black BY, Oil Black BS and Oil Black T-505 (products of Orient Kagaku Kogyo KK) and Victoria Pure Blue, Crystal Violet (CI42555), Methyl Violet (CI42535), Rhodamine B (CI45170B), Malachite Green (CI142000) and Methylene Blue. Dyes described in GB-A-3192729 are particularly preferred.

When the photosensitive composition of the present invention is used for a lithographic plate, an addition of organic acid having 3.0 or less, preferably 1.0 or less of pKa value at 25° C. into the photosensitive composition results in an increase of deletion-speed at areas having unwanted images using a deletion liquid which is disclosed in, for example, U.S. Pat. No. 4,396,703.

As the organic acids which can be used in the present invention, sulfonic acids, sulfinic acids, alkylsulfates, phosphonic acids, and phosphinic acids are preferred. Of them, sulfonic acids and sulfinic acids are more preferred.

Typical examples of the organic acids include naphthalene-2-sulfonic acid, naphthalene-1-sulfonic acid, p-toluenesulfonic acid, dodecylbenzenesulfonic acid, mesitylenesulfonic acid, methanesulfonic acid, ethanesulfonic acid, benzenesulfonic acid, m-benzene-disulfonic acid, cyclohexysulfamic acid, p-toluidine-2-sulfonic acid, pyridine-3-sulfonic acid, phenyl-J-acid, p-toluenesulfinic acid, benzylsulfinic acid, methanesulfinic acid, phenylphosphonic acid, methylphosphonic acid, chloromethylphosphonic acid, dimethylphosphinic acid, diphenylphosphate, diphenyl phosphite, ethyl sulfate, etc. In addition, carboxylic acids and phenols having small pKa value, such as trifluoroacetic acid, trichloroacetic acid, 2,6-dichlorobenzoic acid, picric acid, etc. can be used in the present invention.

The organic acid used in the present invention may have two or more functional groups providing acidic property per molecule, as long as the organic acid contains at least one functional group having 3 or less of pKa value in a molecule. Examples of the organic acids are shown below.

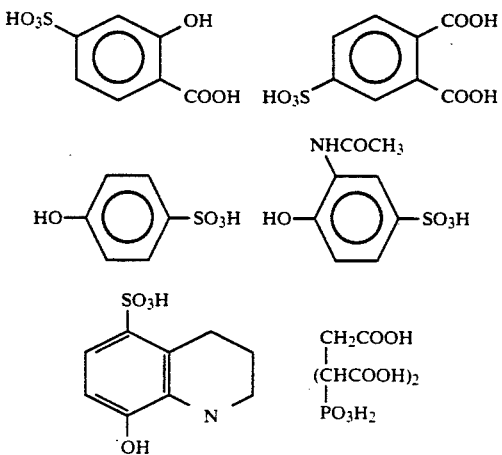

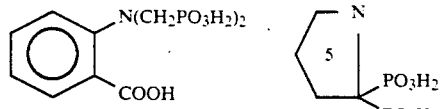

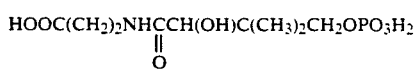

The organic acids used in the present invention include also a compound which is not an organic acid before being incorporated into the photosensitive solution, but is decomposed in a photosensitive solution comprising a photosensitive composition dissolved in an organic solvent after being incorporated into the photosensitive solution, with a high decomposition speed, preferably 50% or more of decomposition ratio in 24 hours, to form an organic acid. As the organic acids, sulfonyl halide, sulfonate, etc. are preferably used. Examples of the organic acids are illustrated below.

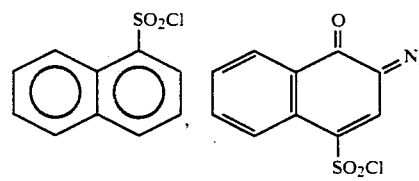

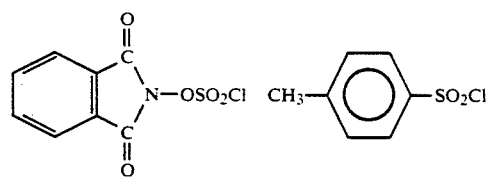

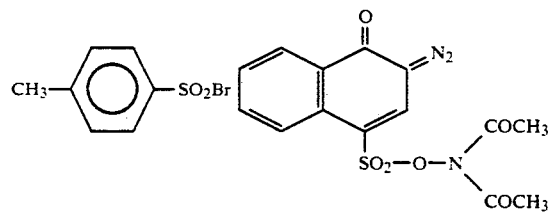

Sulfonyl halides described above are decomposed acceleratingly by using a protic polar solvent such as N,N-dimethylformamide, dimethylsulfoxide, N-methylpyrrolidone, N,N-dimethylacetamide, etc. as a part of coating solvent to form a sulfonic acid. Therefore, in many cases, sulfonyl halides act in the same manner as sulfonic acid.

The amount of the organic acid used in the present invention is preferably from 0.05 to 5 wt %, more preferably from 0.2 to 2 wt % based on the whole photosensitive composition, and the mixture of organic acids may be used.

The composition of the present invention is dissolved in an appropriate solvent capable of dissolving the above-described ingredients and the resulting solution is coated on a support. Typical examples of the solvent include ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethyl sulfoxide, dimethylacetamide, dimethylformamide, water, N-methyl-pyrrolidone, tetrahydrofurfuryl alcohol, acetone, diacetone aclohol, methanol, ethanol, isopropanol and diethylene glycol dimethyl ether. These solvents may be used either alone or as a mixture of two or more of them. The concentration, on a solid basis, of the composition is from 2 to 50% by weight. The amount to be coated varies depending on the use of the composition, but is preferably from 0.5 to 3.0 g/m$^2$ on a solid basis, with regard to photosensitive lithographic plates. With a decrease in the amount to be coated, photosensitivity is increased, but the physical properties of photosensitive films are lowered.

In order to improve coatability, a surfactant such as a fluorine-containing surfactant disclosed in EP-A-230995 may be added to the composition of the present invention. The amount of the surfactant to be added is preferably from 0.01 to 1% by weight, more preferably from 0.05 to 0.5% by weight based on the total amount of the photosensitive composition.

When lithographic plates are prepared by using the photosensitive composition of the present invention, aluminum sheet is preferred as a support. As the aluminum sheet, any of pure aluminum sheet and aluminum alloy sheet can be used. As the aluminum alloy, various alloys such as alloys of aluminum with silicon, copper, manganese, magnesium, chromium, zinc, lead, bismuth, nickel, etc. can be used. These composition may contain neglectable amounts of impurities in addition to some iron and titanium.

If desired, the surface of the aluminum sheet may be treated. For example, the surface treatment is preferably conducted by graining treatment, immersion treatment in an aqueous solution of sodium silicate, potassium fluorozirconate, a phosphate or the like or anodic oxidation treatment. Preferred examples of the aluminum sheet include the aluminum sheet obtained by graining an aluminum sheet and then immersing it in an aqueous solution of sodium slicate according to the method described in British Patent 851,819 and the aluminum sheet obtained by treating an aluminum sheet by anodic oxidation and then immersing it in an aqueous solution of an alkali metal silicate as described in U.S. Pat. No. 3,181,461. The anodic oxidation treatment is carried out by using the aluminum sheet as an anode and allowing electric current to flow therethrough in an electrolytic solution composed of one or a combination of two or more of aqueous solutions or non-aqueous solutions of inorganic acids such as phosphoric acid, chromic acid, sulfuric acid, boric acid, etc., or organic acids such as oxalic acid, sulfamic acid, etc. or salts thereof.

Silicate electrodeposition disclosed in U.S. Pat. No. 3,658,662 can be effectively used.

These hydrophilization treatments is made for the purpose of preventing the undesirable reactions of the support with the photosensitive composition provided thereon from taking place and of improving the adhesion of the support to the photosensitive layer in addition to make the surface of the support hydrophilic.

If desired, pretreatments from removing rolling mill oil from the surface of the support and cleaning the surface thereof may be conducted prior to graining of the aluminum sheet. For the former, solvents such as trichloroethylene, surfactants, etc. are used, while for the latter, there are widly carried out methods wherein alkali etching agents such as sodium hydroxide, potassium hydroxide, etc. are used.

As the graining method, any of mechanical, chemical and electrochemical methods is effective. Examples of the mechanical method include ball polishing method, blast polishing method and brush polishing method wherein the surface of the support is rubbed with an aqueous slurry of an abrasive such as pumice by using a nylon brush, etc. As the chemical method, there is preferred a method described in U.S. Pat. No. 4,201,836 wherein the support is immersed in a saturated aqueous solution of aluminum salt of a mineral acid. As the electrochemical method, there is preferred a method wherein AC electrolysis is carried out in an acidic electrolytic solution such as hydrochloric acid, nitric acid or a mixture thereof. Among these roughening methods, there is particularly preferred a roughening method composed of a combination of mechanical roughening with electrochemical roughening as disclosed in U.S. Pat. No. 4,476,006, because adhesion of fat-sensitive image to the support is firmly made.

It is desirable that the above-described sand dressing methods are conducted to such an extent that center line surface roughness (Ha) on the surface of the aluminum sheet becomes 0.3 to 1.0$\mu$.

The thus grained aluminum sheet may be optionally washed with water or chemically etched.

The etching solution is generally chosen from among aqueous solutions of acids or bases capable of dissolving aluminum. However, etching agents must be those which can form a film on the etched surface, said film being composed of a component which originates from the etching solution and is different aluminum.

Preferred examples of the etching agents include basic materials such as sodium hydroxide, potassium hydroxide, trisodium phosphate, disodium hydrogenphosphate, tripotassium phosphate, dipotassium hydrogenphosphate, etc.; and acidic materials such as sulfuric acid, persulfuric acid, phosphoric acid, hydrochloric acid and salts thereof. However, salts of metals having an ionization tendency smaller than that of aluminum are not preferred, because undesirable film is formed on the surface to be etched. For example, zinc, chromium, cobalt, nickel and copper salts are not preferred.

It is most preferred that the concentrations and temperatures of these etching agents are set so that aluminum or its alloy is etched at a solution velocity of 0.3 to 40 g/m$^2$ per minute of immersion time. However, setting may be made so as to give lower or higher solution velocity.

The etching is conducted, for example, by immersing the aluminum sheet in the etching solution or coating it with the etching solution. It is preferred that the aluminum sheet is treated to such an extent that the etched rate is in the range of 0.5 to 10 g/m$^2$.

As the etching agent, aqueous solutions of bases are preferred, because their etching velocity is high. However, since smut is formed, a desmut treatment is usually carried. An acid such as nitric acid, sulfuric acid, phosphoric acid, chromic acid, hydrofluoric acid or borofluoric acid is used for the desmut treatment.

If desired, the etched aluminum sheet is washed with water and anodized. The anodic oxidation can be carried out by any of conventional processes. In one embodiment, an anodized film can be formed on the surface of the aluminum sheet by allowing direct current or alternating current to flow through the aluminum sheet in an aqueous solution or non-aqueous solution of sulfuric acid, phosphoric acid, chromic acid, oxalic acid, sulfamic acid, benzenesulfonic acid or the like or a mixture of two or more of them.

The treating conditions of the anodic oxidation vary depending on electrolytic solutions to be used and can not be generally determined. However, the anodizing conditions are usually such that the concentration of the electrolytic solution is in the range of 1 to 80% by weight, the temperature of the solution is from 5° to 70° C., current density is from 0.5 to 60 A/dm$^2$, voltage is from 1 to 100 V and electrolytic time is from 30 seconds to 50 minutes.

Among the anodic oxidation treatments, there are preferred a process wherein anodic oxidation is conducted with a high current density in sulfuric acid as disclosed in U.K. Patent 1,412,768, a process wherein the anodic oxidation is conducted in low-concentration sulfuric acid as described in U.S. Pat. No. 4,211,619 and a process wherein the anodic oxidation is conducted by using phosphoric acid as an electrolytic bath as described in U.S. Pat. No. 3,511,661.

If desired, the thus-roughed, anodized aluminum sheet may be hydrophilized. Preferred examples of the hydrophilizing treatment are a method using an aqueous solution of an alkali metal silicate such as sodium silicate disclosed in U.S. Pat. Nos. 2,714,066 and 3,181,461, a method using potassium fluorozirconate disclosed in JP-B-36-22063 and a method using polyvinylsulfonic acid disclosed in U.S. Pat. No. 4,153,461.

An undercoating layer composed of a water-soluble compound can be provided on the surface of the aluminum sheet which has been roughened, anodized and optionally hydrophilized. Examples of the water-soluble compound include combinations of a water-soluble metal salt with hydrophilic cellulose (e.g., a combination of zinc chloride with carboxymethyl cellulose, a combination of magnesium chloride with hydroxyethylcellulose) disclosed in U.S. Pat. No. 3,860,426, polyacrylamide disclosed in U.S. Pat. No. 3,511,661, polyvinylphosphonic acid disclosed in U.S. Pat. No. 4,153,461, amino acids and salts thereof (e.g., alkali metal salts such as Na salt and K salt, ammonium salt, hydrochloride, oxalate, acetate, phosphate, etc.) disclosed in U.S. Pat. No. 4,801,527 and amines having hydroxyl group and salts thereof (e.g., hydrochloride, oxalate, phosphate, etc.) disclosed in U.S. Pat. No. 4,801,527. Among them, amino acids and salts thereof, amines having hydroxyl group and salts thereof are particularly preferred. It is preferred that the undercoating layer composed of the water-soluble compound is provided in the range of from 1 mg/m$^2$ to 80 mg/m$^2$ on a solid basis.

Suitable developing solutions for the photosensitive compositions of the present invention include aqueous solutions of inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and ammonia water. Such developing solutions are added in such an amount as to give a concentration of 0.1 to 10% by weight, preferably 0.5 to 5% by weight.

If desired, a surfactant or an organic solvent such as an alcohol may be added to said aqueous alkaline solution. Detailed compositions of the developing solutions appear in U.S. Pat. Nos. 4,259,434; 4,469,776; 4,606,995 and 4,452,880.

Examples of light sources to be used for exposure include carbon are lamp, mercury vapor lamp, xenon lamp, tungsten lamp, metal halide lamp, etc.

The photosensitive compositions of the present invention are excellent in coatability when coated on the support and are excellent in developability when exposed area is developed by using the aqueous alkaline developing solution after coating, drying and image exposure. The resulting relief image has good wear resistance and good adhesion to the support. When they are used as printing plates, many sheets of prints of good quality can be obtained.

Many sheets of prints of good quality can also be obtained even when printing is made by using UV ink.

The present invention is now illustrated in more detail by reference to the following examples and synthesis examples which, however, are not to be construed as limiting the present invention in any way.

SYNTHESIS EXAMPLE 1

170.2 g (1.0 mole) of p-aminobenzenesulfonamide and 700 ml of tetrahydrofuran were placed in one liter three-necked flask equipped with a stirrer, a cooling coil and a dropping funnel and stirred in an ice-water bath. 52.3 g (0.5 mole) of methacrylic acid chloride was added dropwise from the dropping funnel to the mixture over a period of about one hour. After the completion of dropping, the ice-water bath was removed and the mixture was stirred at room temperature for 30 minutes and then stirred further for one hour while heating it in an oil bath at 60° C. After the completion of the reaction, the reaction mixture was introduced into 3 l of water with stirring, stirred for 30 minutes and filtered to obtain N-(p-aminosulfonylphenyl)methacrylamide as a white solid. The white solid was purified by recrystallizing it from a mixed solvent of water-acetone (yield: 39.3 g).

9.72 g (0.0408 mole) of the thus-obtained N-(p-aminosulfonylphenyl)methacrylamide, 7.93 g (0.0792 mole) of methyl methacrylate and 50 ml of N,N-dimethylformamide were placed in a 200 ml three-necked flask equipped with a stirrer and a cooling coil and stirred while heating them in a water bath at 64° C. 0.246 g of $\alpha,\alpha'$-azobisisobutyronitrile was added to the mixture and the resulting mixture was stirred in a nitrogen atmosphere for five hours while keeping the temperature at 64° C. After the completion of the reaction, the reaction mixture was introduced into 2 l of water with stirring and then stirred for 30 minutes. The product was recovered by filtration and dried to obtain 16 g of a white solid. The molecular weight of the white solid was measured by gel permeation chromatography. The product (the high-molecular compound (a) of the present invention) was found to have a weight-average molecular weight of 49,000 (in terms of polystyrene).

SYNTHESIS EXAMPLE 2

31.0 g (0.36 mole) of methacrylic acid, 39.1 g (0.36 mole) of ethyl chloroformate and 200 ml of acetonitrile were placed in a 500 ml three-necked flask equipped with a stirrer, a cooling coil and a dropping funnel and stirred in an ice-water bath. 36.4 g (0.36 mole) of triethylamine was added dropwise from the dropping funnel to the mixture over a period of about one hour. After the completion of dropping, the ice-water bath was removed and the mixture was stirred at room temperature for 30 minutes and placed in an oil bath.

51.7 g (0.30 mole) of p-aminobenzenesulfonamide was added to the reaction mixture and the resulting mixture was stirred for one hour while heating it in the oil bath at 70° C. After the completion of the reaction, the reaction mixture was poured into one liter of water with stirring and then stirred for 30 minutes. The resulting solid was recovered by filtration and slurried in 500 ml of water. The slurry was filtered and the product was dried to give N-(p-aminosulfonylphenyl)methacrylamide as a white solid (yield: 46.9 g).

4.61 g (0.0192 mole) of N-(p-aminosulfonylphenyl)-methacrylamide, 2.94 g (0.0258 mole) of ethyl methacrylate, 0.80 g (0.015 mole) of acrylonitrile and 20 g of N,N-dimethylacetamide were placed in a 200 ml three-necked flask equipped with a stirrer, a cooling coil and a dropping funnel and stirred while heating it in a water bath at 65° C. 0.15 g of V-65 (a product of Wako Junyaku Co; 2,2'-azobis(2,4-dimethylvaleronitrile)) was added to the mixture and the resulting mixture was stirred in a nitrogen atmosphere for two hours while keeping the temperature at 65° C. A mixture consisting of 4.61 g of N-(p-aminosulfonylphenyl)methacryamide, 2.94 g of ethyl methacrylate, 0.80 g of acrylonitrile, N,N-dimethylacetamide and 0.15 g of V-65 was added dropwise from the dropping funnel to the above reaction mixture over a period of two hours. After the completion of dropping, the mixture was stirred at 65° C. for additional two hours. After the completion of the reaction, 40 g of methanol was added thereto to cool it and introduced into 2 l of water with stirring. After the mixture was stirred for 30 minutes, the product was recovered by filtration and dried to give 15 g of a white solid. The molecular weight of the white solid was measured by gel permeation chromatography. The product (the high-molecular compound (b) of the present invention) was found to have a weight-average molecular weight of 53,000 (in terms of polystyrene).

SYNTHESIS EXAMPLES 3 TO 5

In the same way as in Synthesis Example 1 or 2, high-molecular compounds (c) to (e) given in Table 1 were synthesized. These high-molecular compounds were found to have a weight-average molecular weight of 9,000 to 80,000 (in terms of polystyrene).

TABLE 1

| High-molecular compound of invention | Structural unit | Molar ratio of structural units |
|---|---|---|
| (a) | —(CH$_2$—C(CH$_3$))— CONH—C$_6$H$_4$—SO$_2$NH$_2$    /    —(CH$_2$—C(CH$_3$))—COOCH$_3$ | 34:66 |
| (b) | —(CH$_2$—C(CH$_3$))— CONH—C$_6$H$_4$—SO$_2$NH$_2$    /    —(CH$_2$—C(CH$_3$))—COOCH$_2$CH$_3$    /    —(CH$_2$—CH)—CN | 32:43:25 |
| (c) | —(CH$_2$—C(CH$_3$))— CONH—C$_6$H$_4$—SO$_2$NH$_2$    /    —(CH$_2$—C(CH$_3$))—COOCH$_2$CH$_3$    /    —(CH$_2$—C(CH$_3$))—COOH | 30:67:3 |
| (d) | —(CH$_2$—C(CH$_3$))— CONH—C$_6$H$_4$(m-SO$_2$NH$_2$)    /    —(CH$_2$—C(CH$_3$))—COOCH$_3$    /    —(CH$_2$—CH)—CN | 27:41:32 |
| (e) | —(CH$_2$—C(CH$_3$))— CONH—C$_6$H$_4$—SO$_2$NHCH$_2$CH$_3$    /    —(CH$_2$—C(CH$_3$))—COOCH$_3$ | 43:57 |

SYNTHESIS EXAMPLE 6

40 g (0.298 mole) of 2,2-dihydroxymethylpropionic acid and 100 ml of acetic anhydride were placed in a 500 ml three-necked flask equipped with a stirrer, a cooling coil and a dropping funnel and stirred in an ice-water bath. 100 ml of pyridine was added dropwise from the dropping funnel to the mixture over a period of about 30 minutes. After the completion of the addition, the ice-water bath was removed and the mixture was stirred while heating it in an oil bath at 60° C. After the completion of the reaction, hydrochloric acid was added to acidify the mixture. Extraction with chloroform was conducted by using a separatory funnel. The chloroform layer was washed with water and dehydrated over anhydrous sodium sulfate. The solvent was distilled off from the chloroform solution under vacuum to give 57 g of 2,2-diacetoxymethylpropionic acid as a white solid.

30 g (0.137 mole) of 2,2-diacetoxymethylpropionic acid and 20 ml of thionyl chloride were put into a 300 ml three-necked flask equipped with a stirrer, a cooling coil and a dropping funnel and stirred for two hours while heating them at 80° C.

After the completion of the reaction, unreacted thionyl chloride was thoroughly removed by distilling off it under reduced pressure. The resulting reaction product was sufficiently cooled in an ice-water bath. A mixture of 46.6 g (0.274 mole) of p-aminobenzenesulfonamide and 150 ml of tetrahydrofuran was added dropwise from the dropping funnel to the reaction produce over a period of about one hour. After the completion of the addition, the mixture was stirred for two hours while heating it in an oil bath at 60° C. After the completion of the reaction, the reaction mixture was introduced into 2 l of water with stirring and then stirred for 30 minutes. The mixture was then filtered to obtain p-(1,1-diacetoxymethylethylcarbonylamino)-benzene sulfonamide as a white solid. The white solid was recrystallized from ethanol to purify it (yield: 26 g).

22 g (0.06 mole) of p-(1,1-diacetoxymethylethylcarbonylamino) benzenesulfonamide, 4.8 g (0.12 mole) of sodium hydroxide, 50 ml of ethanol and 50 ml of water were placed in a 300 ml three-necked flask equipped with a stirrer and a cooling coil and heated to reflux for two hours. The reaction mixture was introduced into one liter of water with stirring and then stirred for 30 minutes. The formed p-(1,1-dihydroxymethylethylcarbonylamino) benzenesulfonamide as a white solid was recovered by filtration. The white solid was recrystallized form ethanol to purify it (yield: 11 g).

5.73 g (0.02 mole) of p-(1,1-dihydroxymethylethyl-carbonylamino) benzenesulfonamide, 5.26 g (0.021 mole) of 4,4'-diphenylmethane diisocyanate and 18 g of N,N-dimethylacetamide were placed in a 100 ml three-necked flask equipped with a stirrer and a cooling coil and stirred for two hours while heating them at 100° C. After the completion of the reaction, the reaction mixture was introduced into 500 ml of water with stirring and then stirred for 30 minutes. The precipitate was recovered by filtration and dried to give 10 g of a white solid. The molecular weight of the white solid was measured by means of gel permeation chromatography. The product (the high-molecular compound (f) of the present invention) was found to have a weight-average molecular weight of 32000 (in terms of polystyrene).

EXAMPLES 1 TO 6 AND COMPARATIVE EXAMPLE 1

The surface of an aluminum sheet was grained by using a nylon brush and an aqueous suspension of pumice stone having a particle size of 400 mesh and thoroughly washed with water. The aluminum sheet was etched by immersing it in a 10% sodium hydroxide at 70° C. for 60 seconds, washed with running water, neutralized and washed with 20% $HNO_3$ and then washed with water. The resulting aluminum sheet was subjected to an electrolytic roughening treatment with quality of electricity an anode of 160 coulomb/dm$^2$ in an aqueous solution of 1% nitric acid by using sine wave alternating current under condition of $V_A = 12.7$ V. The surface roughness was measured and found to have a roughness (Ra) of 0.6μ. The aluminum sheet was then subjected to desmut treatment at 55° C. for two minutes by immersing it in an aqueous solution of 30% $H_2SO_4$. The resulting aluminum sheet was then anodized at a current density of 2 A/dm$^2$ in an aqueous solution of 20% $H_2SO_4$ to give a film of 2.7 g/m$^2$ in thickness.

The following five photosensitive solutions [A]-1 to [A]-5 with variation in the kinds of the high-molecular compounds of the present invention in the photosensitive solutions [A] were prepared. Further, the following photosensitive solution (B) was prepared by using the high-molecular compound (f) of the present invention. The anodized aluminum sheet was coated with each of these photosensitive solutions and then dried at 100° C. for two minutes to prepare each of photosensitive lithographic plates [A]-1 to [A]-5 and [B]. The coating weight was 2.5 g/m$^2$ on a dry basis.

The high-molecular compounds of the present invention, which were used in the photosensitive solutions [A]-1 to [A]-5, were given in Table 2.

| Photosensitive solution [A] | |
|---|---|
| Ester of naphthoquinone-1,2-diazide-5-sulfonyl chloride with pyrogallol-acetone resin (described in Example 1 of U.S. Pat. 3,635,709) | 0.45 g |
| High-molecular compound of the present invention (Table 2) | 1.10 g |
| 2-(p-Methoxyphenyl)-4,6-bis (trichloromethyl)-s-triazine | 0.02 g |
| Oil Blue #603 (a product of Orient Kagaku Kogyo KK) | 0.01 g |
| Methyl ethyl ketone | 10 g |
| Mthyl cellosolve | 10 g |
| Photosensitive solution [B] | |
| Ester of naphthoquinone 1,2-diazide-5-sulfonyl chloride with pyrogallol-acetone resin (described in Example 1 of U.S. Pat. 3,635,709) | 0.45 g |
| High-molecular compound (f) of present invention (Table 2) | 0.5 g |
| Cresol formaldehyde novolak resin | 0.6 g |
| 2-(p-Methoxyphenyl)-4,6-bis (trichloromethyl)-s-triazine | 0.02 g |
| Oil Blue #603 (a product of Orient Kagaku Kogyo KK) | 0.01 g |
| Ethylene chloride | 10 g |
| Methyl cellosolve | 10 g |

As comparative Example, the aluminum sheet was coated with the photosensitive solution (C) in the same way as in the Photosensitive solutions [A] and [B] to prepared a photosensitive lithographic plate [C]. The coating weight was 2.5 g/m$^2$ on a dry basis.

| Photosensitive solution [C] | |
|---|---|
| Ester of naphthoquinone-1,2-diazide-5-sulfonyl chloride with pyrogallol-acetone resin (described in Example 1 of U.S. Pat. 3,635,709) | 0.45 g |
| Cresol-formaldehyde novolak resin | 1.10 g |
| 2-(p-Methoxyphenyl)-4,6-bis (trichloromethyl)-s-triazine | 0.02 g |
| Oil Blue #603 (a product of Orient Kagaku Kogyo KK) | 0.01 g |
| Ethylene chloride | 10 g |
| Methyl cellosolve | 10 g |

A positive transparent original image of line drawing and halftone image was closely contact with the surface of the photosensitive layer to each of the photosensitive lithographic plates [A]-1 to [A]-5, [B] and [C] and exposure was conducted at a distance of 70 cm by using 30 ampere carbon arc lamp.

The exposed photosensitive lithographic plates [A]-1 to [A]-5, [B] and [C] were developed by immersing them in a 8-fold diluted aqueous solution of DP-4

(Trade name, manufactured by Fuji Photo Film Co., Ltd.) at 25° C. for 60 seconds.

Printing was made on the best quality paper by using the resulting lithographic plates [A]-1 to [A]-5, [B] and [C], commercially available normal ink and UV ink on KOR type printer (manufactured by Heidelberg). The number of finally sheets of paper printed by the lithographic plates [A]-1 to [A]-5, [B] and [C] was examined. The results are shown in Table 2.

TABLE 2

| Lithographic plate (Ex. No.) | High-molecular compound used | The number of sheets of printed paper by normal ink | The number of sheets of printed paper by UV ink |
|---|---|---|---|
| [A]-1 EX. 1 | compound (a) of the invention | 60,000 | 30,000 |
| [A]-2 EX. 2 | compound (b) of the invention | 65,000 | 35,000 |
| [A]-3 EX. 3 | compound (c) of the invention | 55,000 | 25,000 |
| [A]-4 EX. 4 | compound (b) of the invention | 65,000 | 40,000 |
| [A]-5 EX. 5 | compound (e) of the invention | 60,000 | 35,000 |
| [B] EX. 6 | compound (f) of the invention | 70,000 | 40,000 |
| [C] Comp. Ex. 1 | cresol-formaldehyde novolak resin | 50,000 | 8,000 |

It is apparent from the Table 2 that the lithographic plates [A]-1 to [A]-5 and [B] (Examples 1 to 6) obtained by using the high-molecular compounds of the present invention are very superior to the plate [C] of Comparative Example in the number of sheets of printed paper as well as printing durability even when any of normal ink and UV ink is used.

EXAMPLES 7 TO 10 AND COMPARATIVE EXAMPLE 2

The surface of an aluminum sheet of 0.24 mm in thickness was grained by using a nylon brush and an aqueous suspension of pumice stone having a particle size of 400 mesh and thoroughly washed with water to prepare a substrate [I]. The substrate [I] was etched by immersing it in a 10% sodium hydroxide solution at 70° C., washed with running water, neutralized and washed with 20% $HNO_3$ and washed with water. The resulting substrate was subjected to an electrolytic roughening treatment with quantity of electricity of 400 coulomb/dm$^2$ in an aqueous solution of 0.7% nitric acid by using sine wave alternating current under condition of 12.7 V, and then washed with water to prepare a substrate [II].

The substrate [II] was treated to such an extent that the dissolved amount of the surface thereof in an aqueous solution of 10% sodium hydroxide reaches 0.9 g/m$^2$. The substrate was washed with water, subjected to a desmut treatment by neutralizing it with a 20% nitric acid solution and washing it and then anodized in an aqueous solution of 18% sulfuric acid so as to give an oxide film of 3 g/m$^2$.

The resulting aluminum sheet was coated with each of three photosensitive solutions [D]-1 to [D]-3 with variation in kinds of the high-molecular compounds of the present invention in the following photosensitive solution [D]. The coated sheet was dried at 100° C. for two minutes and photosensitive lithographic plates [D]-1 to [D]-3 were prepared.

Further, the following photosensitive solutions [E] and [F] were prepared and the aluminum sheet was coated with each of them in the same way as in [D]-1 to [D]-3 to prepare photosensitive lithographic plates [E] and [F].

The coating weight was 2.5 g/m$^2$ on a dry basis.

The high-molecular compounds of the present invention, which were used for the photosensitive solutions [D]-1 to [D]-3 and [E], are given in Table 3.

| Photosensitive solution [D] | |
|---|---|
| Ester of 2,3,4-trihydroxybenzophenone with naphthoquinone-1,2-diazide-5-sulfonyl chloride (degree of esterification: 90 mol %) | 0.45 g |
| High-molecular compound of the present invention (Table 3) | 0.77 g |
| Cresol (m-isomer 60%, o-isomer 40%)-formaldehyde resin (weight-average molecular weight: 4,000) | 0.33 g |
| 2-(p-Methoxyphenyl)-4,6-bis (trichloromethyl)-s-triazine | 0.02 g |
| Naphthoquinone-1,2-diazide-4-sulfonyl chloride | 0.01 g |
| Victoria Pure Blue BOH (a product of Hodogaya Kagaku KK) | 0.015 g |
| Megafac F-177 (fluorine-containing surfactant, a product of Dainippon Ink & Chemical Inc.) | 0.004 g |
| Dimethylformamide | 4 g |
| 1-Methoxy-2-propanol | 9 g |
| Methyl ethyl ketone | 7 g |
| Photosensitive solution [E] | |
| Ester of 3,3,3',3'-tetramethyl-1,1'-spirobiindane-5,6,7,5',6',7'-hexol with naphthoquinone-1,2-diazide-5-sulfonyl chloride (photosensitive substance (a) of Example 1 of Japanese Patent Application No. 62-233292) | 0.45 g |
| High-molecular compound of the present invention (Table 3) | 0.77 g |
| Cresol (m-isomer 60%, o-isomer 40%)-formaldehyde resin (weight-average molecular weight: 4,000) | 0.33 g |
| 2-(p-Methoxyphenyl)-4,6-bis (trichloromethyl)-s-triazine | 0.02 g |
| Victoria Pure Blue BOH (dye manufactured Hodogaya Kagaku KK) | |
| Megafac F-177 (fluorine-containing surfactant, a product of Dainippon Ink & Chemical Inc.) | 0.004 g |
| Dimethyl sulfoxide | 5 g |
| Methyl lactate | 8 g |
| Methyl ethyl ketone | 7 g |

Photosensitive Solution [F]

A photosensitive solution wherein 1.1 g of a cresol (m-isomer 60%, o-isomer 40%)-formaldehyde resin (weight-average molecular weight: 4,000) was used in place of the high-molecular compound of the present invention in the photosensitive solution (D).

The evaluation of photosensitive lithographic plates [D]-1 to [D]-3, [E] and [F] was made in the same way as in Examples 1 to 6 and Comparative Example 1. The results are shown in Table 3.

It is apparent from Table 3 that the lithographic plates [D]-1 to [D]-3 and [E] (Examples 7 to 10) obtained by using the high-molecular compounds of the present invention are very superior to the plate [F] of Comparative Example in printing durability, even when any of normal ink and UV ink.

TABLE 3

| Lithographic plate (Example No.) | High-molecular compound used | The number of sheets of printed paper by normal ink | The number of sheets of printed paper by UV ink |
| --- | --- | --- | --- |
| [D]-1 EX. 7 | compound (b) of the invention | 65,000 | 33,000 |
| [D]-2 EX. 8 | compound (d) of the invention | 65,000 | 38,000 |
| [D]-3 EX. 9 | compound (f) of the invention | 70,000 | 38,000 |
| [E] EX. 10 | compound (b) of the invention | 65,000 | 33,000 |
| [F] Comp. Ex. 2 | cresol-formaldehyde resin | 50,000 | 8,000 |

EXAMPLES 11 TO 26

Photosensitive lithographic plates were prepared in the same manner as in Example 7, except for using the high-molecular compounds shown in Table 4, and using a photosensitive solution containing 0.007 g of organic acids having different pKa values.

A positive transparent original image of line drawing and halftone image was closely contact with the surface of the photosensitive layer to each of the photosensitive lithographic plates and exposure was conducted at a distance of 1 m by using 2 Kw metal halide lamp.

The exposed photosensitive lithographic plates were developed by immersing them in an 8-fold diluted aqueous solution of DP-4 (Trade name, manufactured by Fuji Photo Film Co., Ltd.) at 25° C. for 60 seconds.

A deletion-speed of the lithographic plates thus obtained was measured as is shown below.

A deletion liquid disclosed in Example 7 of U.S. Pat. No. 4,396,703 was coated on images and a coating time sufficient to have no stain on images when the lithographic plate was subjected to printing was measured. The coating time means a time after coating of the deletion liquid on images until a completion of washing-out the deletion liquid by water.

As is apparent from the results of Table 4, a deletion-speed becomes higher when an organic acid having 3 or less of pKa value was used.

TABLE 4

| Example | High-molecular Compound | Organic Acid | pKa of Organic Acid | Deletion Speed |
| --- | --- | --- | --- | --- |
| 11 | a | Naphthalene-2-sulfonic Acid | 1.0 or less | 10 sec |
| 12 | a | Diphenyl Phosphate | 1.0 or less | 15 sec |
| 13 | a | Picirc Acid | 0.7 | 15 sec |
| 14 | a | Benzoid Acid | 4.2 | 2 min |
| 15 | a | Adipic Acid | 4.4 | 2 min |
| 16 | a | — | — | 2 min |
| 17 | b | p-toluene-sulfonic Acid | 1.0 or less | 10 sec |
| 18 | b | — | — | 3 min |
| 19 | c | Phenyl-Phosphonous Acid | 2.0 | 20 sec |
| 20 | c | Naphthalene-1-sulfonic Acid | 1.0 or less | 10 sec |
| 21 | c | — | — | 1 min 40 sec |
| 22 | d | Methane-sulfonic Acid | 1.0 or less | 10 sec |
| 23 | d | — | — | 2 min |
| 24 | e | Mesitylene-sulfonic Acid | 1.0 or less | 10 sec |
| 25 | e | p-Hydroxy-benzene-sulfonic acid | 1.0 or less | 15 sec |
| 26 | e | — | — | 2 min 15 sec |

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising (i) a high-molecular weight compound including a pendant sulfonamide group, said high-molecular weight compound being insoluble in water, but soluble in an aqueous alkaline solution, and (ii) a positive working photosensitive o-naphthoquinone diazide compound, photosensitive polymer compound having o-nitrocarbinol ester group or photosensitive combination of a compound generating an acid by photolysis with a compound having a —C—O—Si group which is dissociated by an acid, wherein said high-molecular weight compound is obtained by polymerizing a low-molecular weight compound in a solvent in the presence of an initiator, said low-molecular weight compound being selected from the group consisting of compound represented by formulas (I) to (V)

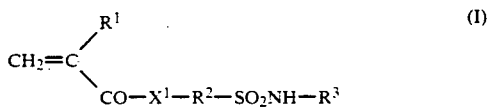

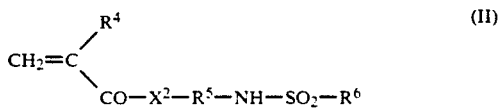

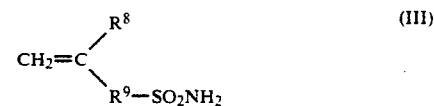

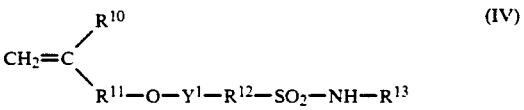

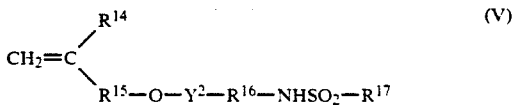

wherein $X^1$ and $X^2$ represent each —O— or —NR$^7$—; $R^1$ and $R^4$ represent each H or $CH_3$; $R^2$ and $R^5$ represent each a substituted or unsubstituted alkylene group, cycloalkylene group, a substituted or unsubstituted arylene group or a substituted or unsubstituted arakylene group, $R^3$ represents a hydrogen atom, a substituted or unsubstituted alkyl group, a substituted or unsubstituted cycloalkyl group, a substituted or unsubstituted aryl group or a substituted or unsubstituted aralkyl group, $R^6$ represents a substituted or unsubstituted alkyl group, a substituted or unsubstituted cycloalkyl group, a substituted or unsubstituted aryl group, or a substituted or unsubstituted aralkyl group; and $R^7$ represent hydrogen atom, a substituted or unsubstituted alkyl group, a substituted or unsubstituted cycloalkyl group, a substituted or unsubstituted aryl group, or a substituted or unsubstituted aralkyl group, $R^8$, $R^{10}$ and $R^{14}$ represent each a hydrogen atom, a halogen atoms or methyl group, $R^9$ represents substituted or unsubstituted alkylene group, a substituted or unsubstituted cycloalkylene group, a substituted or unsubstituted arylene group or a substituted or unsubstituted aralkylene group, $R^{11}$ and $R^{15}$ represent each a single bond or a substituted or unsubstituted alkylene group, a substituted or unsubstituted cycloalkylene group, a substituted or unsubstituted arylene group or a substituted or unsubstituted aralkylene group, $R^{12}$ and $R^{16}$ represent each a substituted or unsubstituted alkylene group, a substituted or unsubstituted cycloalkylene group, a substituted or unsubstituted arylene group or a substituted or unsubstituted aralkylene group, $R^{13}$ represents a hydrogen atom, a substituted or unsubstituted alkyl group, a substituted or unsubstituted cycloalkyl group, a substituted or unsubstituted aryl group or a substituted or unsubstituted aralkyl group, $R^{17}$ represents a substituted or unsubstituted alkyl group, a substituted or unsubstituted cycloalkyl group, a substituted or unsubstituted aryl group or a substituted or unsubstituted aralkyl group, $Y^1$ and $Y^2$ represent each a single bond or

2. A photosensitive composition as claimed in claim 1, wherein said photosensitive compound is an o-naphthoquinone diazide compound.

3. A photosensitive composition as claimed in claim 2, wherein said o-naphthoquinone diazide is the reaction product of a 1,2 diazonaphthoquinone sulfonic acid chloride and a polyhydroxy compound having a molecular weight of not higher than 1,000.

4. A photosensitive composition as claimed in claim 3, wherein the ratio of the reaction product of a 1,2 diazonaphthoquinone sulfonic acid chloride and a polyhydroxy compound which is fully esterified ranges from 20 to 99 mol%.

5. A photosensitive composition as claimed in claim 1, wherein said high-molecular weight compound has a weight-average molecular weight of 5,000 to 300,000.

6. A photosensitive composition as claimed in claim 1, wherein the amount of said high-molecular weight compound to be incorporated into the photosensitive composition is from about 5 to 95%.

7. A photosensitive composition as claimed in claim 1, wherein the amount of the positive working photosensitive compound in the photosensitive composition is from 10 to 50% by weight.

8. A photosensitive composition as claimed in claim 1, wherein said composition further comprises an alkali-soluble high-molecular-weight-compound selected from the group consisting of a phenol-formaldehyde resin, a cresol-formaldehyde resin, a phenol-modified xylene resin, a poly(hydroxystyrene), and a poly(halogenated hydroxy styrene).

9. A photosensitive composition as claimed in claim 8, wherein said alkali-soluble high-molecular-weight compound has a weight-average molecular weight of from 500 to 20,000 and a number-average molecular weight of from 200 to 60,000.

10. A photosensitive composition as claimed in claim 8, wherein the amount of said alkali-soluble high-molecular-weight-compound in the photosensitive composition ranges not more than 70% by weight.

11. A photosensitive composition as claimed in claim 1, wherein said composition further comprises an organic acid having an pKa of 3.0 or less than 3.0.

12. A photosensitive composition as claimed in claim 11, wherein said organic acid is selected from an organic sulfonic acid or an organic sulfinic acid.

13. A photosensitive composition as claimed in claim 12, wherein said organic acid is selected from the group consisting of naphthalene-2-sulfonic acid, naphthalene-1-sulfonic acid, p-toluenesulfonic acid, dodecylbenzenesulfonic acid, mesitylenesulfonic acid, methanesulfonic acid, ethanesulfonic acid, benzenesulfonic acid, meta-benzene-di-sulfonic acid, cyclohexylsulfamic acid, p-toluidine-2-sulfonic acid, pyridine-3-sulfonic acid, phenyl J-acid, p-toluene sulfinic acid, benzylsulfinic acid, and methane sulfinic acid.

14. A photosensitive composition as claimed in claim 12, wherein the amount of the organic acid is in the range from 0.05 to 5% by weight based on the total weight of the composition.

15. A photosensitive composition as claimed in claim 1, wherein said high-molecular weight compound is one obtained by polymerizing a low-molecular weight compound selected from the group consisting of compound represented by formulae (I) and (II)

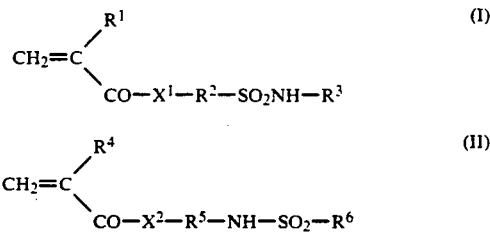

wherein $X^1$ and $X^2$ each represents —NH—, $R^1$ and $R^4$ each represents H or $CH_3$, $R^2$ and $R^5$ each represents an alkylene group having from 2 to 6 carbon atoms, a cycloalkylene group having 5 or 6 carbon atoms, or an optionally substituted phenylene or naphthylene group, $R^3$ represens H, an alkyl group having 1 to 6 carbon atoms, a cycloalkyl group having 5 or 6 carbon atoms, or an optionally substituted phenyl or naphthyl group and $R^6$ represents an alkyl group having 1 to 6 carbon atoms, a cycloalkyl group having 5 or 6 carbon atoms, or an optionally substituted phenylene or naphthylene group.

16. A photosensitive composition as claimed in claim 15, wherein said high-molecular weight compound is one obtained by copolymerizing the low-molecular weight compound with at least one selected from the group consisting of a methacrylate, an acrylate, an methacrylamide, an acrylamide, acrylonitrile, methacrylonitrile, methacrylic acid and acrylic acid.

17. A photosensitive composition as claimed in claim 16, wherein said low molecular weight compound is copolymerized in the range from 10 to 90 mole % based on the copolymer.

18. A photosensitive composition according to claim 15, wherein said low-molecular weight compound is selected from the group consisting of an aminosulfonylphenyl methacrylamide, an aminosulfonylphenyl acrylamide, a sulfonylaminophenyl methacrylamide, a sulfonylaminophenyl acrylamide; an aminosulfonylphenyl methacrylate, an aminosulfonylphenyl acrylate, a sulfonylaminophenyl methacrylate, a sulfonylaminophenyl acrylate, an amino-sulfonylnaphthyl methacrylamide, an aminosulfonylnaphthyl acrylamide, a sulfonylaminonaphthyl methacrylamide, a sulfonylaminonaphthyl acrylamide, an aminosulfonylnaphthyl methacrylate, an aminosulfonylnaphthyl acrylate, a sulfonylaminonaphthyl methacrylate, a sulfonylaminonaphthyl acrylate; an aminosulfonylethyl methacrylamide, an aminosulfonylethyl acrylamide, a sulfonylaminoethyl methacrylamide, a sulfonylaminoethyl acrylamide, an amino-sulfonylethyl methacrylate, an aminosulfonylethyl acrylate, a sulfonylaminoethylmethacrylate, and a sulfonylaminoethyl acrylate.

19. A photosensitive composition according to claim 15, wherein said low-molecular weight compound is selected from the group consisting of N-(o-amino-sulfonylphenyl)methacrylamide, N-(m-aminosulfonylphenyl)methacrylamide, N-(p-aminosulfonylphenyl)methacrylamide, N-(o-methylaminosulfonylphenyl)methacrylamide, N-(m-methylaminosulfonylphenyl)methacrylamide, N-(p-methylaminosulfonylphenyl)methacrylamide, N-(o-ethylaminosulfonylphenyl)methacrylamide, N-(m-ethylaminosulfonylphenyl)methacrylamide, N-(p-ethylaminosulfonylphenyl)methacrylamide, N-(o-n-propylaminosulfonylphenyl)methacrylamide, N-(m-n-propylaminosulfonylphenyl)methacrylamide, N-(p-n-propylaminosulfonylphenyl)methacrylamide, N-(o-isopropylaminosulfonylphenyl)methacrylamide, N-(m-isopropylaminosulfonylphenyl)methacrylamide, N-(p-isopropylaminosulfonylphenyl)methacrylamide, N-(o-n-butylaminosulfonylphenyl)methacrylamide, N-(m-n-butylaminosulfonylphenyl)methacrylamide, N-(p-n-butylaminosulfonylphenyl)methacrylamide, N-(o-isobutylaminosulfonylphenyl)methacrylamide, N-(m-isobutylaminosulfonylphenyl)methacrylamide, N-(p-isobutylaminosulfonylphenyl)methacrylamide, N-(o-sec-butylaminosulfonylphenyl)methacrylamide, N-(m-sec-butylaminosulfonylphenyl)methacrylamide, N-(p-sec-butylaminosulfonylphenyl)methacrylamide, N-(o-t-butylaminosulfonylphenyl)methacrylamide, N-(m-t-butylaminosulfonylphenyl)methacrylamide, N-(p-t-butylaminosulfonylphenyl)methacrylamide, N-(o-phenylaminosulfonylphenyl)methacrylamide, N-(m-phenylaminosulfonylphenyl)methacrylamide, N-(p-phenylaminosulfonylphenyl)methacrylamide, N-(o-(α-naphthylaminosulfonyl)phenyl)methacrylamide, N-(m-(α-naphthylaminosulfonyl)phenyl)methacrylamide, N-(p-(α-naphthylaminosulfonyl)phenyl)methacrylamide, N-(o-(β-naphthylaminosulfonyl)phenyl)methacrylamide, N-(m-(β-naphthylaminosulfonyl)phenyl)methacrylamide, N-(p-(β-naphthylaminosulfonyl)phenyl)methacrylamide, N-(1-3-aminosulfonyl)naphthyl)methacrylamide, N-(1-3-methylaminosulfonyl)naphthyl)methacrylamide, N-(1-3-ethylaminosulfonyl)naphthyl)methacrylamide, N-(o-methylsulfonylamino-phenyl)methacrylamide, N-(m-methylsulfonylaminophenyl)methacrylamide, N-(p-methylsulfonylaminophenyl)methacrylamide, N-(o-ethylsulfonylaminophenyl)methacrylamide, N-(m-ethylsulfonylaminophenyl)methacrylamide, N-(p-ethylsulfonylaminophenyl)methacrylamide, N-o-phenylsulfonylaminophenyl)methacrylamide, N-(m-phenylsulfonylaminophenyl)methacrylamide, N-(p-phenylsulfonylaminophenyl)methacrylamide, N-(o-(p-methylphenylsulfonylamino)phenyl)methacrylamide, N-(m-(p-methylphenylsulfonylamino)phenyl)methacrylamide, N-(p-(p-methylphenylsulfonylamino)phenyl)methacrylamide, N-(p-(p-methylphenylsulfonylamino)phenyl)methacrylamide, N-(p-(α-naphthylsulfonylamino)phenyl)methacrylamide, N-(p-(β-naphthylsulfonylamino)phenyl)methacrylamide, N-(2-methylsulfonylaminoethyl)methacrylamide, N-(2-ethylsulfonylaminoethyl)methacrylamide, N-(2-phenylsulfonylaminoethyl)methacrylamide, N-(2-p-methylphenylsulfonylaminoethyl)methacrylamide, N-(2-α-naphthylsulfonylaminoethyl)methacrylamide, N-(2-β-naphthylsulfonylaminoethyl)methacrylamide, o-aminosulfonylphenyl methacrylate, m-aminosulfonylphenyl methacrylate, p-aminosulfonylphenyl methacrylate, o-methyl-aminosulfonylphenyl methacrylate, m-methylaminosulfonylphenyl methacrylate, p-methylaminosulfonylphenyl methacrylate, o-ethylaminosulfonylphenyl methacrylate, m-ethylaminosulfonylphenyl methacrylate, p-ethylaminosulfonylphenyl methacrylate, o-n-propylaminosulfonylphenyl methacrylate, m-n-propylaminosulfonylphenyl methacrylate, p-n-propylaminosulfonylphenyl methacrylate, o-isopropylaminosulfonylphenyl methacrylate, m-isopropylamino-sulfonylphenyl methacrylate, o-n-butylaminosulfonylphenyl methacrylate, m-n-butylaminosulfonylphenyl methacrylate, p-n-butylaminosulfonylphenyl methacrylate, m-isobutylaminosulfonylphenyl methacrylate, p-isobutylaminosulfonyl-phenyl methacrylate, m-sec-buthylaminosulfonylphenyl methacrylate, p-sec-butylaminosulfonylphenyl methacrylate, m-t-butylaminosulfonylphenyl methacrylate, p-t-butylaminosulfonylphenyl methacrylate, o-phenylaminosulfonylphenyl methacrylate, m-phenylaminosulfonylphenyl methacrylate, p-phenylaminosulfonylphenyl methacrylate, m-(α-naphthylaminosulfonyl)phenyl methacrylate, p-(α-naphthylaminosulfonyl)phenyl methacrylate, m-(β-naphthylaminosulfonyl)phenyl methacrylate, p-(β-naphthylaminosulfonyl)phenyl methacrylate, 1-(3-aminosulfonyl)naphthyl methacrylamide, 1-(3-methylaminosulfonyl)naphthyl methacrylamide, 1-(3-ethylaminosulfonyl)naphthyl methacrylamide, o-methylsulfonylaminophenyl methacrylate, m-methylsulfonylaminophenyl methacrylate, p-methylsulfonylaminophenyl methacrylate, o-ethylsulfonylaminophenyl methacrylate, m-ethylsulfonylaminophenyl methacrylate, p-ethylsulfonylaminophenyl methacrylate, o-phenylsulfonylaminophenyl methacrylate, m-phenylsulfonylaminophenyl methacrylate, p-phenylsulfonylaminophenyl methacrylate, o-(p-methylphenylsulfonylamino)phenyl methacrylate, m-(p-methylphenylsulfonylamino)phenyl methacrylate, p-(p-methylphenylsulfonyl)phenyl methacrylate, p-(α-naphthylsulfonylamino)phenyl methacrylate, p-(β-naphthylsulfonylamino)phenyl methacrylate, 2-methylsulfonylaminoethyl methacrylate, 2-ethylsulfonylaminoethyl methacrylate, 2-phenylsulfonylaminoethyl methacrylate, 2-p-methylphenylsulfonylaminoethyl methacrylate, 2-α-naphthylsulfonylaminoethyl methacrylate and 2-β-naphthylsulfonylaminoethyl methacrylate.

* * * * *